United States Patent
Lee et al.

(10) Patent No.: US 7,880,165 B2
(45) Date of Patent: Feb. 1, 2011

(54) MOLECULAR ELECTRONIC DEVICE INCLUDING ELECTRODE HAVING CONDUCTIVE POLYMER ELECTRODE LAYER

(75) Inventors: Hyoyoung Lee, Daejeon (KR); Junghyun Lee, Daejeon (KR); Ja Ryong Koo, Seoul (KR); Mi Hee Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 489 days.

(21) Appl. No.: 11/776,917

(22) Filed: Jul. 12, 2007

(65) Prior Publication Data
US 2008/0116451 A1 May 22, 2008

(30) Foreign Application Priority Data
Nov. 16, 2006 (KR) .................. 10-2006-0113484
Mar. 27, 2007 (KR) .................. 10-2007-0030010

(51) Int. Cl.
*H01L 51/30* (2006.01)
*H01L 51/00* (2006.01)

(52) U.S. Cl. .................. 257/40; 257/642; 257/759; 257/E51.025; 257/E51.027

(58) Field of Classification Search .................. 257/40, 257/E51.025, E51.027, 642, 759
See application file for complete search history.

(56) References Cited

U.S. PATENT DOCUMENTS

| | | | |
|---|---|---|---|
| 4,898,804 A * | 2/1990 | Rauschenbach et al. | 430/311 |
| 5,403,680 A * | 4/1995 | Otagawa et al. | 429/213 |
| 7,132,678 B2 * | 11/2006 | Kagan et al. | 257/40 |
| 2003/0108728 A1 * | 6/2003 | Heath et al. | 428/209 |
| 2004/0195688 A1 * | 10/2004 | Beck et al. | 257/751 |
| 2004/0219731 A1 | 11/2004 | Hartwich et al. | |
| 2005/0231855 A1 * | 10/2005 | Tran | 360/324.1 |

FOREIGN PATENT DOCUMENTS

| | | |
|---|---|---|
| KR | 1020030097323 | 12/2003 |
| KR | 10-2004-0033006 | 4/2004 |
| KR | 10-2004-0102480 | 12/2004 |
| KR | 10-2005-0019969 | 3/2005 |

OTHER PUBLICATIONS

Akkerman et al. "Towards molecular electronics with large-area molecular junctions", May 4, 2006, Nature Letters, vol. 441, pp. 69-72.*
Akkerman Hylke B., "Towards molecular electronics with large-area molecular junctions", Nature Letters vol. 441, p. 69, May 4, 2006.*
Hylke B. Akkerman, Paul W. M. Blom, Dago M. de Leeuw, and Bert de Boer, "Towards molecular electronics with large-area molecular junctions," vol. 441, May 4, 2006, Nature, pp. 69-72.

* cited by examiner

*Primary Examiner*—Ngan Ngo
*Assistant Examiner*—Benjamin Tzu-Hung Liu
(74) *Attorney, Agent, or Firm*—Rabin & Berdo, P.C.

(57) ABSTRACT

Provided is a molecular electronic device including an electrode including a conductive polymer electrode layer. The molecular electronic device includes a first electrode; a funtional molecular active layer, self-assembled on the first electrode, including an electroactive functional group having a cyclic compound; and a second electrode disposed on the functional molecular active layer. The second electrode includes a conductive polymer electrode layer contacting with the functional molecular active layer and a metal electrode layer disposed on the conductive polymer electrode layer. The conductive polymer electrode layer of the second electrode prevents damage to the functional molecular active layer, thereby preventing a short circuit in an ultra-thin molecular electronic device.

11 Claims, 4 Drawing Sheets

MOLECULAR ELECTRONIC DEVICE INCLUDING ELECTRODE HAVING CONDUCTIVE POLYMER ELECTRODE LAYER

CROSS-REFERENCE TO RELATED PATENT APPLICATION

This application claims the benefits of Korean Patent Application No. 10-2006-0113484, filed on Nov. 16, 2006, and No. 10-2007-0030010, filed on Mar. 27, 2007, in the Korean Intellectual Property Office, the disclosures of which are incorporated herein in their entirety by reference.

BACKGROUND OF THE INVENTION

1. Field of the Invention

The present invention relates to a molecular electronic device, and more particularly, to a molecular electronic device in which a functional molecular active layer capable of providing electrical characteristics is interposed between two metal electrodes.

2. Description of the Related Art

In recent years, as it has become known that organic materials have semiconductor characteristics due to the presence of conjugated pi electrons, much research into organic semiconductor devices has been conducted. Most of the research is related to electron transport characteristics of an organic material layer interposed between two metal electrodes. Recently, the development of molecular switching devices or memory devices using functional molecules having aromatic rings with electron-acceptor groups has been actively conducted. In particular, as commercially available semiconductor devices which are nano-sized (of the scale of several tens of nanometers) are being competitively developed, the development of more highly integrated and further miniaturized molecular electronic devices is increasingly in demand.

A currently available molecular electronic device is fundamentally structured such that a functional molecular active layer is interposed between two metal electrodes. The functional molecular active layer provides organic semiconductor characteristics between the two metal electrodes. Recently, a technique of forming a functional molecular active layer as a molecular monolayer on a metal electrode using a self-assembly process has been proposed. According to this technique, the functional molecular active layer formed as a molecular monolayer has a very thin thickness of several nanometers, and thus, when a metal for forming an electrode is deposited on the functional molecular active layer, damage to the functional molecular active layer may occur. In particular, when using Ti and Au as metal materials, Ti and Au may permeate a relatively sparse functional molecular active layer upon deposition, thereby causing a short circuit in molecular electronic devices. This makes practical utilization of molecular electronic devices difficult.

SUMMARY OF THE INVENTION

The present invention provides an ultra-highly integrated molecular electronic device employing the electrical characteristics of a functional molecular active layer, which is finely structured to have dimensions of several to several tens of nanometers. The molecular electronic device is structured such that damage to the functional molecular active layer can be prevented, thus preventing the occurrence of short circuit. Therefore, the molecular electronic device can effectively exhibit desired electrical characteristics.

According to an aspect of the present invention, there is provided a molecular electronic device including: a first electrode; a functional molecular active layer, self-assembled on the first electrode, including an electroactive functional group having a cyclic compound; and a second electrode disposed on the functional molecular active layer. The second electrode includes a conductive polymer electrode layer contacting with the functional molecular active layer and a metal electrode layer disposed on the conductive polymer electrode layer.

The functional molecular active layer may be formed as a molecular layer by selectively binding a compound comprising a thiol derivative or a silane derivative as an anchoring group on the first electrode using a self-assembly process.

The first electrode and the second electrode may each be a monolayer made of a single metal or a multi-layer having a stack of at least two different metals. The metal electrode layer of the second electrode may have a stack structure of a barrier layer and a metal layer. Here, the barrier layer contacts with the conductive polymer electrode layer.

In the molecular electronic device according to the present invention, during forming the metal electrode layer of the second electrode, the conductive polymer electrode layer can prevent damage to the functional molecular active layer. Therefore, the molecular electronic device according to the present invention can form a reliable switching/memory device, thereby increasing the possibility of the practical utilization of the switching/memory device. Moreover, in the molecular electronic device according to the present invention, a charging effect of a voltage applied between the first electrode and the second electrode can be controlled by optimizing the thickness of the conductive polymer electrode layer of the second electrode formed on the ultra-thin functional molecular active layer which is formed to a thickness of several nanometers on the first electrode. Therefore, the molecular electronic device according to the present invention can be realized as an ultra-thin molecular electronic device which is finely structured at several nanometer scales.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those of ordinary skill in the art. In the accompanying drawings, the thickness and width of layer(s) or region(s) are exaggerated for the sake of clarity. The same reference numerals refer to the same constitutional elements throughout the specification.

Figure 1A:
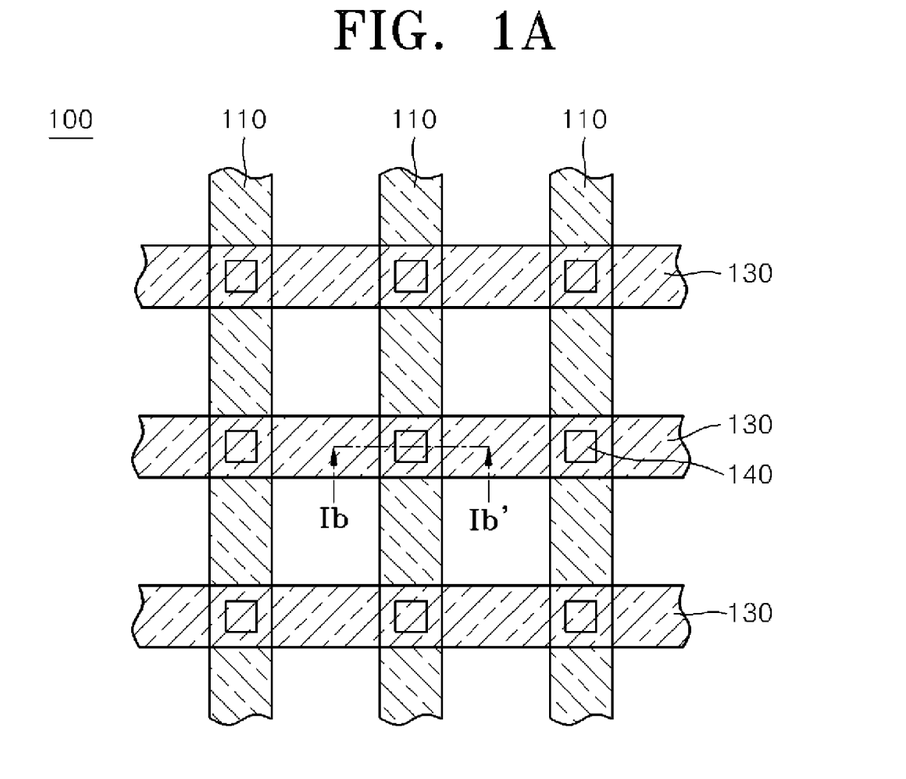
FIG. 1A is a layout illustrating a molecular electronic device according to an embodiment of the present invention.
Figure 1B:
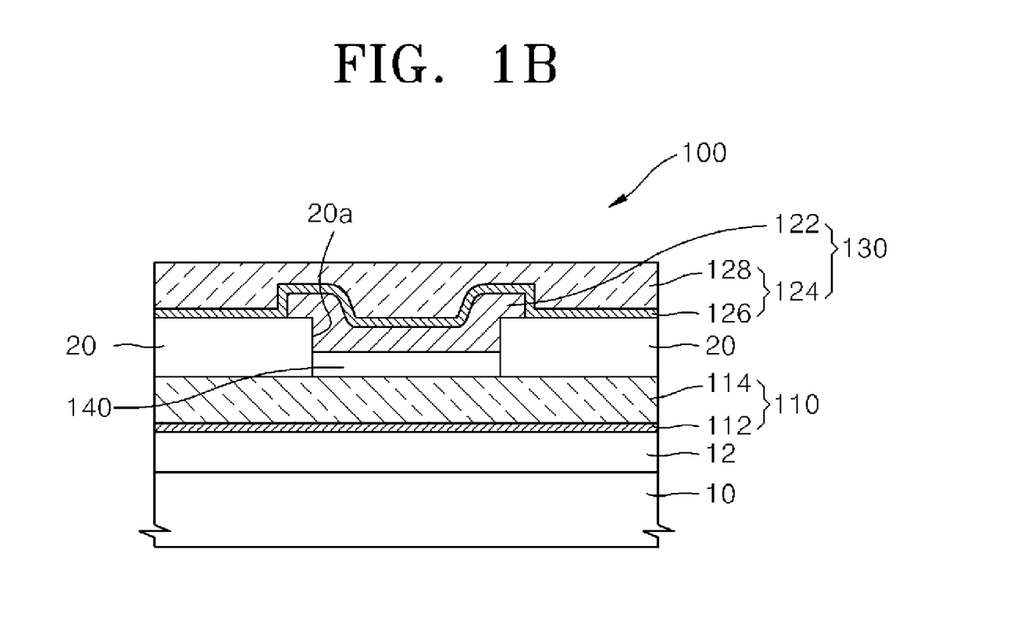
FIG. 1B is a sectional view taken along a line Ib-Ib' of FIG. 1A.

FIG. 1A is a layout illustrating a molecular electronic device 100 according to an embodiment of the present invention. FIG. 1A illustrates the molecular electronic device 100 in which a first electrode 110 and a second electrode 130 are arranged in a 3×3 array. FIG. 1B is a sectional view taken along a line Ib-Ib' of FIG. 1A.

Referring to FIGS. 1A and 1B, in the molecular electronic device 100, the first electrode 110 and the second electrode 130 are extended to orthogonally intersect with each other at predetermined positions of an insulating layer 12 disposed on a substrate 10. For example, the substrate 10 may be a silicon substrate, and the insulating layer 12 may be made of silicon oxide, silicon nitride, or a combination thereof.

The first electrode 110 may be made of a metal. For example, as illustrated in FIG. 1B, the first electrode 110 may include a first barrier layer 112 and a first metal layer 114. The first barrier layer 112 may be made of Ti. In some cases, the first barrier layer 112 may be omitted. The first metal layer 114 may be made of gold, platinum, silver, or chromium.

The second electrode 130 includes a conductive polymer electrode layer 122 and a metal electrode layer 124. The metal electrode layer 124 is disposed on the conductive polymer electrode layer 122 to cover the conductive polymer electrode layer 122. The metal electrode layer 124 may have a stack structure of a second barrier layer 126 and a second metal layer 128, as illustrated in FIG. 1B. The second barrier layer 126 is formed to contact with the conductive polymer electrode layer 122. The second barrier layer 126 serves to prevent the diffusion of metal elements deposited thereon into the underlying structure. For example, the second barrier layer 126 may be made of Ti. In some cases, the second barrier layer 126 may be omitted. The second metal layer 128 may be made of gold, platinum, silver, or chromium.

Insulating layer patterns 20 are interposed between the first electrode 110 and the second electrode 130. For example, the insulating layer patterns 20 may be made of silicon nitride, silicon oxide, or a combination thereof. A nano via-hole 20a is formed in a region of the insulating layer patterns 130 corresponding to an intersection between the first electrode 110 and the second electrode 130. The nano via-hole 20a may be formed to a width of about 100 to 160 nm.

A functional molecular active layer 140 including an electroactive functional group having a cyclic compound is disposed on a surface of the first electrode 110 exposed through the nano via-hole 20a. The functional molecular active layer 140 may be formed as a molecular layer that is self-assembled on a surface of the first electrode 110. For example, the functional molecular active layer 140 may be a molecular layer formed by selectively binding a compound having a thiol derivative or a silane derivative as an anchoring group on a surface of the first electrode 110 using a self-assembly process. By way of another example, the functional molecular active layer 140 may also be a molecular layer formed by selectively binding a compound having an azo or carboxyl group as an anchoring group on a surface of the first electrode 110 using a self-assembly process.

The functional molecular active layer 140 may be formed as a molecular monolayer or a molecular multilayer having a stack of at least two molecular layers according to the chemical structure of a material of the functional molecular active layer 140. Examples of materials suitable for the functional molecular active layer 140 will be provided later.

The conductive polymer electrode layer 122 of the second electrode 130 is interposed between the metal electrode layer 124 of the second electrode 130 and the functional molecular active layer 140. The conductive polymer electrode layer 122 is formed on the functional molecular active layer 140 to contact with an upper surface of the functional molecular active layer 140 in order to prevent the permeation of a material of the metal electrode layer 124 of the second electrode 130 into the underlying functional molecular active layer 140 or damage to the functional molecular active layer 140 upon deposition of the metal electrode layer 124.

For example, the conductive molecular electrode layer 122 may be made of PEDOT/PSS (poly(3,4-ethylenedioxythiophene) doped with poly(4-styrenesulonate)), polyaniline, polyaniline doped with sulfonic acid, polypyrrole, polythiophene, poly(3,4-ethylenethiophene), polyporphyrin, or polymetallocene.

The conductive polymer electrode layer 122 is required to have an appropriate thickness to prevent a short circuit that may be caused by breakage of the functional molecular active layer 140 in the molecular electronic device 100. The thickness of the conductive polymer electrode layer 122 can be determined according to the dimensions (e.g., thickness) of the functional molecular active layer 140, the insulating layer patterns 20, and their neighboring elements. In order to manufacture a molecular electronic device which is finely structured at the scale of several to several tens of nanometers according to a recent trend in the molecular electronic device field, the conductive polymer electrode layer 122 may be formed to a thickness of about 10 to 100 nm. Examples of materials suitable for the conductive polymer electrode layer 122 will be provided later.

Figure 2A:
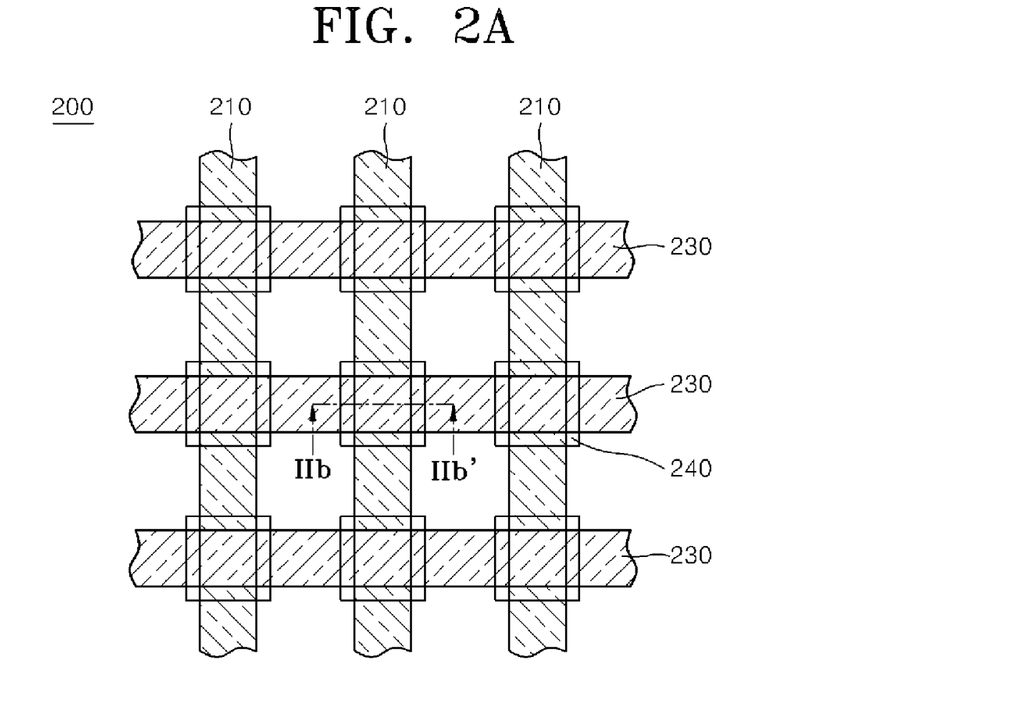
FIG. 2A is a layout illustrating a molecular electronic device according to another embodiment of the present invention.
Figure 2B:
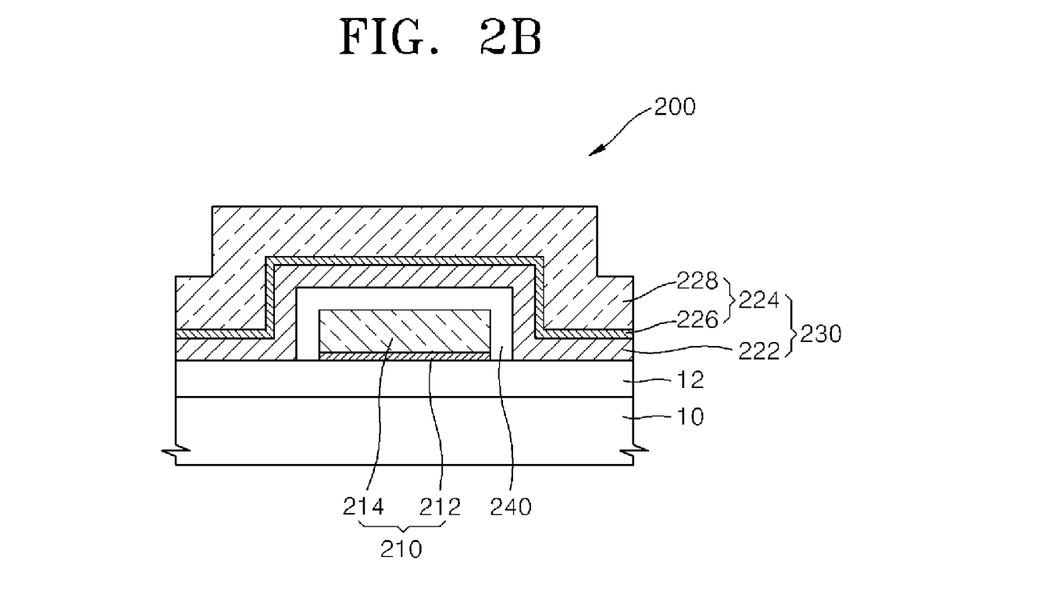
FIG. 2B is a sectional view taken along a line IIb-IIb' of FIG. 2A.

FIG. 2A is a layout illustrating a molecular electronic device 200 according to another embodiment of the present invention. FIG. 2A illustrates the molecular electronic device 200 in which a first electrode 210 and a second electrode 230 are arranged in a 3×3 array. FIG. 2B is a sectional view taken along a line IIb-IIb' of FIG. 2A. In FIGS. 2A and 2B, the same reference numerals as in FIGS. 1A and 1B refer to the same constitutional elements.

Referring to FIGS. 2A and 2B, in the molecular electronic device 200, the first electrode 210 and the second electrode 230 are extended to orthogonally intersect with each other at predetermined positions of an insulating layer 12 disposed on a substrate 10. The first electrode 210 and the second electrode 230 are similar to the first electrode 110 and the second electrode 130 described above with reference to FIGS. 1A and 1B. That is, the first electrode 210 may include a first barrier layer 212 and a first metal layer 214. The second electrode 230 includes a conductive polymer electrode layer 222 and a metal electrode layer 224. The metal electrode layer 224 may have a stack structure of a second barrier layer 226 and a second metal layer 228. The description of the first barrier layer 212 and the first metal layer 214 constituting the first electrode 210 is the same as that of the first barrier layer 112 and the first metal layer 114 described with reference to FIG. 1B. The description of the conductive polymer electrode layer 222 and the metal electrode layer 224 (including the second barrier layer 226 and the second metal layer 228) constituting the second electrode 230 is the same as that of the conductive polymer electrode layer 122 and the metal electrode layer 124 including the second barrier layer 126 and the second metal layer 128 described with reference to FIG. 1B.

Upper and side surfaces of the first electrode 210 are covered with a functional molecular active layer 240. The functional molecular active layer 240 may be formed as a molecular layer that is self-assembled on a surface of the first electrode 210. The description of the functional molecular active layer 240 is the same as that of the functional molecular active layer 140 described with reference to FIG. 1B. Examples of materials suitable for the functional molecular active layer 240 will be provided later.

The conductive polymer electrode layer 222 of the second electrode 230 is interposed between the functional molecular active layer 240 and the metal electrode layer 224 of the second electrode 230, and serves to prevent damage to the functional molecular active layer 240, thereby preventing a short circuit.

Figure 3:
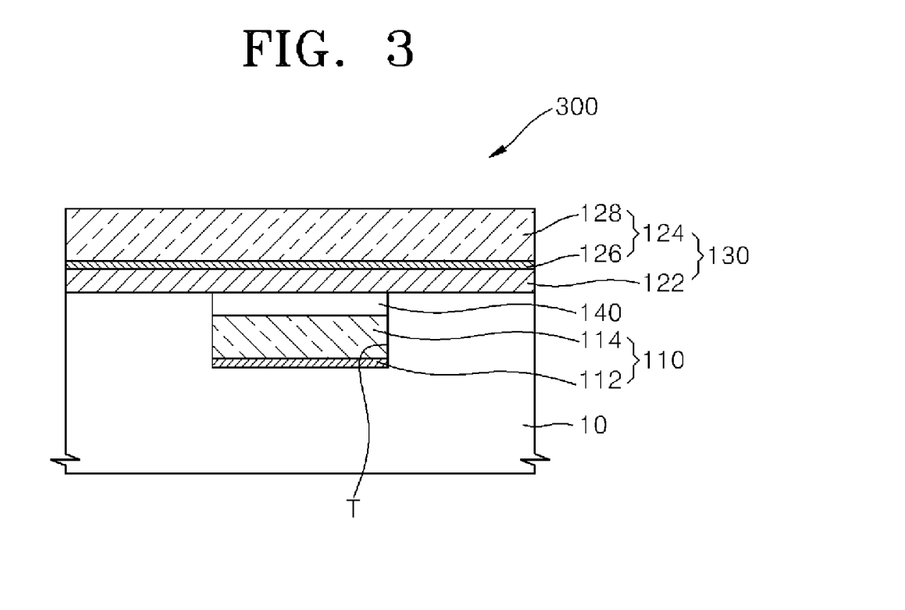
FIG. 3 is a sectional view illustrating a molecular electronic device according to another embodiment of the present invention.

FIG. 3 is a sectional view illustrating a molecular electronic device 300 according to another embodiment of the present invention. FIG. 3 illustrates the molecular electronic device 300 having a trench structure. A plan structure corresponding to the sectional view of FIG. 3 may have a layout as illustrated in FIG. 1A or 2A. FIG. 3 illustrates a sectional view as taken along the line IIb-IIb' of FIG. 2A. In FIG. 3, the same reference numerals as in FIGS. 1A-1B and 2A-2B refer to the same or similar constitutional elements, and thus, detailed descriptions thereof will be omitted.

Referring to FIG. 3, in the molecular electronic device 300, a first electrode 100 is disposed in a trench T formed in a substrate 10. An insulating layer (not shown) is interposed between the substrate 10 and the first electrode 110.

A functional molecular active layer 140 is disposed on the first electrode 110.

A second electrode 130 is disposed on the functional molecular active layer 140. The second electrode 130 includes a conductive polymer electrode layer 122 protecting the functional molecular active layer 140 and a metal electrode layer 124 disposed on the conductive polymer electrode layer 122.

In the molecular electronic devices 100, 200, and 300 according to the above-described embodiments of the present invention, the functional molecular active layers 140 and 240 may be made of a compound exhibiting rectification or hysteresis characteristics, e.g., a compound containing an electron donor-acceptor thiol or silane group. For example, the functional molecular active layers 140 and 240 may be made of a compound selected from the group consisting of nitrophenylene ethylene thiol or silane group-containing compounds; dinitrobipyridyl ethynylphenyl thiol compounds; S-[4-({4-[(4-acetylsulfanyl-phenyl)-methyl-amino]-phenyl}-methyl-amino)-phenyl thiol compounds; rosebengal thiol or silane group-containing compounds; azo compounds containing a dinitrothiophen group and a thiol or silane derivative-introduced aminobenzene group; and organometallic thiol or silane derivative compounds with complexes of a terpyridyl group and a metal element (e.g., cobalt, nickel, iron, ruthenium).

The nitrophenylene ethylene thiol or silane group-containing compounds may be represented by Formulae 1 and 2 below:

<Formula 1> wherein $R_1$ is SH, $SiCl_3$, or $Si(OCH_3)_3$, and

<Formula 2> wherein $R_2$ is SH, $SiCl_3$, or $Si(OCH_3)_3$.

The dinitrobipyridyl ethynylphenyl thiol compounds and the S-[4-({4-[(4-acetylsulfonyl-phenyl)-methyl-amino]-phenyl}-methyl-amino)-phenyl thiol compounds may be respectively represented by Formulae 3 and 4 below:

<Formula 3> wherein $R_3$ is SH, $SiCl_3$, or $Si(OCH_3)_3$, and n is an integer of 2 to 20, and

<Formula 4> wherein $R_4$ is SH, $SiCl_3$, or $Si(OCH_3)_3$, and n is an integer of 2 to 20.

The rosebengal thiol or silane group-containing compounds may be represented by Formula 5 below:

<Formula 5> wherein $R_5$ is SH, $SiCl_3$, or $Si(OCH_3)_3$, and n is an integer of 2 to 20.

The azo compounds containing a dinitrothiophen group and a thiol or silane derivative-introduced aminobenzene group may be represented by Formulae 6, 7, and 8 below:

<Formula 6> wherein n is an integer of 1 to 20,

<Formula 7> wherein $R_6$ is a hydrogen atom, $C_1$-$C_{20}$ alkyl, phenyl, or $(CH_2)nSR_7$ where $R_7$ is a hydrogen atom, an acetyl group, or a methyl group, and n is an integer of 1 to 20, and

<Formula 8> wherein n is an integer of 1 to 20.

The organometallic thiol or silane derivative compounds with complexes of a terpyridyl group and a metal element may be represented by Formula 9 below:

<Formula 9>

$R_8$=$SCOCH_3$, $R_9$=H, m=n=0
$R_8$=$R_9$=$SCOCH_3$, m=n=0
$R_8$=$SCOCH_3$, $R_9$=H, m=7, n=0
$R_8$=$R_9$=$SCOCH_3$, m=n=7
$R_8$=$SCOCH_3$, $R_9$=H, m=13, n=0
$R_8$=$R_9$=$SCOCH_3$, m=n=13 wherein Me is cobalt, nickel, iron, or ruthenium.

In the compounds represented by Formulae 1 through 9, a thiol derivative or a silane derivative serves as a specific functional group (an alligator clip) capable of being self-assembled on the first electrode 110 or 210. That is, in the molecular electronic device 100, 200, or 300 according to the present invention, the functional molecular active layer 140 or 240 is formed as a molecular layer on the first electrode 110 or 210 by selectively binding an anchoring group such as a thiol derivative or a silane derivative on the first electrode 110 or 210 using a self-assembly process. The thickness of the molecular layer constituting the functional molecular active layer 140 or 240 can be determined by appropriately adjusting the length of an alkyl chain in a compound constituting the molecular layer, i.e., by appropriately adjusting the value of m or n in —$(CH_2)_m$— or —$(CH_2)_n$—.

The molecular electronic devices 100, 200, and 300 illustrated in FIGS. 1A through 3 may be used as switching devices that can switch between an "on" state and an "off" state according to a voltage applied between the first electrode 110 or 210 and the second electrode 130 or 230. Moreover, the molecular electronic devices 100, 200, and 300 according to the present invention may also be used as memory devices that store predetermined electrical signals in response to a voltage applied between the first electrode 110 or 210 and the second electrode 130 or 230. That is, a molecular electronic device according to the present invention can provide memory characteristics and switching characteristics.

In the molecular electronic devices 100, 200, and 300 according to the above-described embodiments of the present invention, the conductive polymer electrode layers 122 and 222 constituting the second electrodes 130 and 230 may be made of a material selected from various conductive polymer materials.

PEDOT/PSS, which is one of conductive polymer materials forming the conductive polymer electrode layers 122 and 222, is represented by Formula 10 below:

<Formula 10>

When the conductive polymer electrode layers 122 and 222 are made of PEDOT/PSS, the electroconductivity of the conductive polymer electrode layers 122 and 222 is determined according to the mass ratio of PEDOT to PSS. Here, as the mass ratio of PSS to PEDOT is increased, the electroconductivity of the conductive polymer electrode layers 122 and 222 decreases. The use of PEDOT/PSS can achieve electroconductivity of up to 400 to 500 S/cm. Thus, the conductive polymer electrode layers 122 and 222 made of PEDOT/PSS can provide excellent electroconductivity.

In order to form the conductive polymer electrode layers 122 and 222 of the second electrodes 130 and 230 using PEDOT/PSS, for example, the following process can be used. First, PEDOT/PSS is dissolved in water, DMF (dimethylformamide), or a polar organic solvent commonly known in the art, such as alcohols. The reaction mixture is directly spin-coated on the functional molecular active layers 140 and 240. The polar organic solvent used herein may be a polar organic solvent that can effectively dissolve a material forming the conductive polymer electrode layers 122 and 222 and that can be easily removed. After the spin coating, the resultant structure may be dried in a vacuum oven set to a pressure of about $10^{-1}$ to $10^{-3}$ Torr and a temperature of about 110° C. for about 5 to 20 minutes in order to remove the used solvent.

The formation of the second electrode 130 or 230 including the conductive polymer electrode layer 122 or 222 on the functional molecular active layer 140 or 240 enables production of a structure in which the conductive polymer electrode layer 122 or 222 is interposed between the functional molecular active layer 140 or 240 and the metal electrode layer 124 or 224 of the second electrode 130 or 230. Therefore, even when manufacturing an ultra thin molecular electronic device having dimensions of several nanometers, it is possible to prevent damage or degradation of a functional molecular active layer that may be caused during deposition of a metal electrode layer, thereby preventing a short circuit that may be caused by damage or degradation of a functional molecular active layer of an ultra thin molecular electronic device. As such, this makes practical utilization of an ultra thin molecular electronic device possible.

Hereinafter, manufacturing examples of molecular electronic devices according to the present invention will be described.

EXAMPLE 1

Manufacture of Molecular Electronic Devices

Insulating layers were formed on silicon substrates. Then, conductive layers in which Ti layers with a thickness of about 5 nm and Au layers with a thickness of about 30 nm were sequentially stacked were formed and patterned to form first electrodes of a line pattern as illustrated in FIG. 1A. The line width of the first electrodes was 50 nm. In order to form the first electrodes, a photoresist material was spin-coated on the insulating layers and imprinted using a stamp to form desired mask patterns. Then, Ti and Au were sequentially deposited using an e-beam deposition process, and the mask patterns were removed. In this Example, a nanoimprint technique was used to form the first electrodes. However, the first electrodes can also be formed using a photolithography process commonly known in the art. Moreover, the first electrodes may also be formed in trenches obtained by etching the silicon substrates as illustrated in FIG. 3.

Next, silicon nitride layer patterns were formed to a thickness of about 60 nm on the resultant structures including the first electrodes. The silicon nitride layer patterns had via holes having a width of about 120 nm through which the first electrodes were exposed.

Next, in order to form functional molecular active layers on surfaces of the first electrodes exposed through the via holes formed in the silicon nitride layer patterns, an organic solvent was first prepared. Compounds forming functional molecular active layers of molecular electronic devices according to the present invention are dissolved in a solvent such as chloroform, dichloromethane, THF (tetrahydrofuran), and DMF (dimethylformamide). For example, a compound forming a functional molecular active layer can be prepared in a concentration of about 1 to 10 mmol in a DMF solution according to the type of the compound. In this Example, 10 ml of a DMF solution in which 1 mmol of an azo compound (n=12) of Formula 6 was dissolved in DMF was prepared. At this time, an oxygen-free and anhydrous DMF solvent was used in a glove box maintained under an oxygen-free and anhydrous atmosphere. The resultant structures including the first electrodes and the silicon nitride layer patterns were dipped in the thus-prepared DMF solution for about 24 hours so that molecular monolayers were self-assembled on surfaces of the first electrodes exposed through the via holes to form functional molecular active layers. Then, the resultant structures were sequentially washed with DMF, THF, ethanol, and distilled water, and dried in a low-temperature vacuum oven (40° C., $10^{-3}$ Torr) for two hours or more.

Next, a solution of a predetermined concentration of PEDOT/PSS of Formula 10 in a DMF solvent was spin-coated on the functional molecular active layers and the surrounding silicon nitride layer patterns in such a manner to completely cover the functional molecular active layers to thereby form conductive polymer electrode layers. Although DMF was used as a solvent in this Example, the present invention is not limited thereto. The solvent may also be distilled water or isopropanol. Here, the thickness of the conductive polymer electrode layers formed by the spin coating is affected mainly by a spin speed, a spin time, and the concentration of PEDOT/PSS.

The thicknesses of the conductive polymer electrode layers obtained under representative spin-coating conditions are presented in Table 1 below. In each sample listed in Table 1, the concentration of PEDOT/PSS in a solution was 1.5 wt %.

TABLE 1

| Sample No. | Spin speed [rpm] | Spin time [sec] | Thickness of conductive polymer electrode layer [nm] |
|---|---|---|---|
| 1 | 400 | 180 | 90 |
| 2 | 500 | 180 | 85 |
| 3 | 800 | 180 | 75 |
| 4 | 1000 | 180 | 55 |
| 5 | 1500 | 180 | 30 |
| 6 | 2000 | 180 | 20 |
| 7 | 2000 | 180 | 15 |

In Table 1, for Sample 5, conductive polymer electrode layers with various thicknesses of about 25 to 35 nm were obtained under the same spin coating conditions. However, in this Example, samples with a thickness of 30 nm were selected as Sample 5 and evaluated. Similarly, for Samples 6 and 7, conductive polymer electrode layers with various thicknesses of about 10 to 20 nm were obtained under the same spin coating conditions. However, in this Example, samples with thicknesses of 15 nm and 20 nm were respectively selected as Samples 6 and 7 and evaluated.

Samples 1-7 of Table 1 were dried on a hot plate set to about 11° C. for about 5 to 20 minutes. Taking into consideration that PEDOT/PSS easily absorbs moisture in the air, Samples 1-7 were dried in a vacuum oven set to about $10^{-1}$ to $10^{-3}$ Torr.

For Samples 1-7, second electrodes were formed on the conductive polymer electrode layers. The formation of the second electrodes was performed in class 1000 cleanroom in order to prevent an inflow of impurities such as dust. The formation of the second electrodes was performed in the same manner as in the formation of the first electrodes except that Ti layers with a thickness of 5 nm and Au layers with a thickness of 65 nm were stacked.

EXAMPLE 2

Evaluation of Electrical Reliability of Molecular Electronic Devices with Respect to the Thickness of Conductive Polymer Electrode Layers In this Example, for molecular electronic devices including conductive polymer electrode layers with various thicknesses, occurrence of a short circuit with respect to the thickness of the conductive polymer electrode layers was evaluated. The evaluation results for Samples 1-7 manufactured in Example 1 are summarized in Table 2 below.

TABLE 2

| Sample No. | The number of evaluated devices | The number of defective devices having short circuit | The number of defect-free devices having no short circuit | Yield (%) |
|---|---|---|---|---|
| 1 | 20 | 0 | 20 | 100 |
| 2 | 20 | 0 | 20 | 100 |
| 3 | 20 | 0 | 20 | 100 |
| 4 | 20 | 1 | 19 | 95 |
| 5 | 20 | 2 | 18 | 90 |
| 6 | 20 | 10 | 10 | 50 |
| 7 | 21 | 14 | 7 | 30 |

In Table 2, the "yield" is a ratio of the number of devices with no short circuit to the number of evaluated devices.

Referring to Table 2, as the thickness of the conductive polymer electrode layers was increased, a short circuit phenomenon decreased.

On the other hand, as the thickness of the conductive polymer electrode layers was increased, the hysteresis of the molecular active layers decreased. That is, taking into consideration both short circuit-free yield and hysteresis characteristics, it can be seen that the optimal thickness of a conductive polymer electrode layer to obtain desired characteristics of a molecular electronic device is about 30 nm.

The above evaluation results are experimental results obtained for resultant devices that are exemplarily formed in predetermined dimensions using predetermined materials. Thus, the evaluation results obtained in this Example are not applied to all molecular electronic devices according to the present invention. That is, optimal conditions for manufacturing molecular electronic devices according to the present invention can vary according to materials and dimensions of elements constituting the molecular electronic devices, and other process parameters. Moreover, it should be understood that elements constituting molecular electronic devices can be formed in various dimensions and materials forming the elements can be diversely selected within the spirit and scope of the present invention.

EXAMPLE 3

Evaluation of Switching Characteristics and Memory Characteristics of Molecular Electronic Devices In order to evaluate switching characteristics and memory characteristics of the molecular electronic devices of Sample 5 manufactured in Example 1, the following experiments were performed.

First, for the molecular electronic devices of Sample 5, measurements for the evaluation were performed in a vacuum chamber maintained at room temperature in order to prevent degeneration (e.g., oxidation) of molecules. Evaluation of current-voltage characteristics was performed using a semiconductor parameter analyzer-HP 4156C (measurements ranging from 1 fA/2V to 1 A/200V). The switching characteristics and memory characteristics of the molecular electronic devices were evaluated from results measured from a (+) voltage to a (−) voltage and from a (−) voltage to a (+) voltage. Also, the switching characteristics were determined for a voltage loop ranging from 0→(+) voltage→(−) voltage→(+) voltage.

Figure 4:
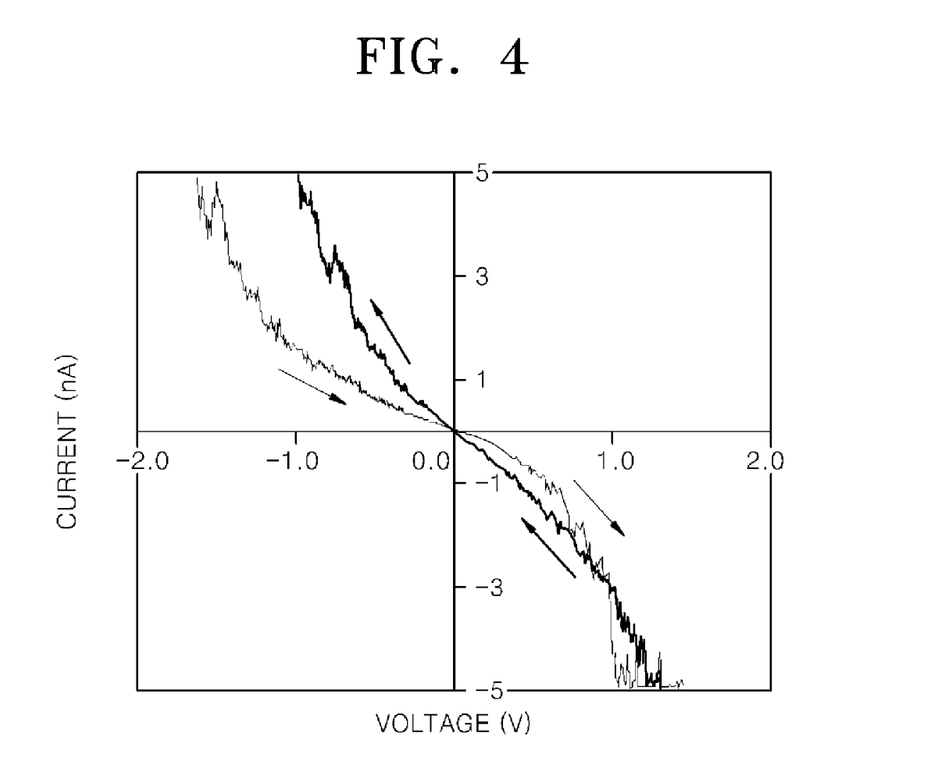
FIG. 4 is a hysteresis graph illustrating the switching characteristics of a molecular electronic device according to an embodiment of the present invention.

FIG. 4 is a hysteresis graph illustrating the switching characteristics of the molecular electronic devices of Sample 5 manufactured in Example 1.

The results of FIG. 4 show that formation of a conductive polymer electrode layer using PEDOT/PSS prevents damage to a functional molecular active layer, thereby preventing a short circuit, resulting in manufacture of a molecular electronic device with desired switching characteristics. Moreover, it can be said that PEDOT/PSS can be used as an electrode material.

Pulse measurement for the evaluation of memory characteristics was performed using a pulse generator unit (HP 41501 expander), which could be connected to a semiconductor parameter analyzer, and a measurement/pulse selection terminal apparatus (SMU-PGU selector, HP 16440A).

Figure 5:
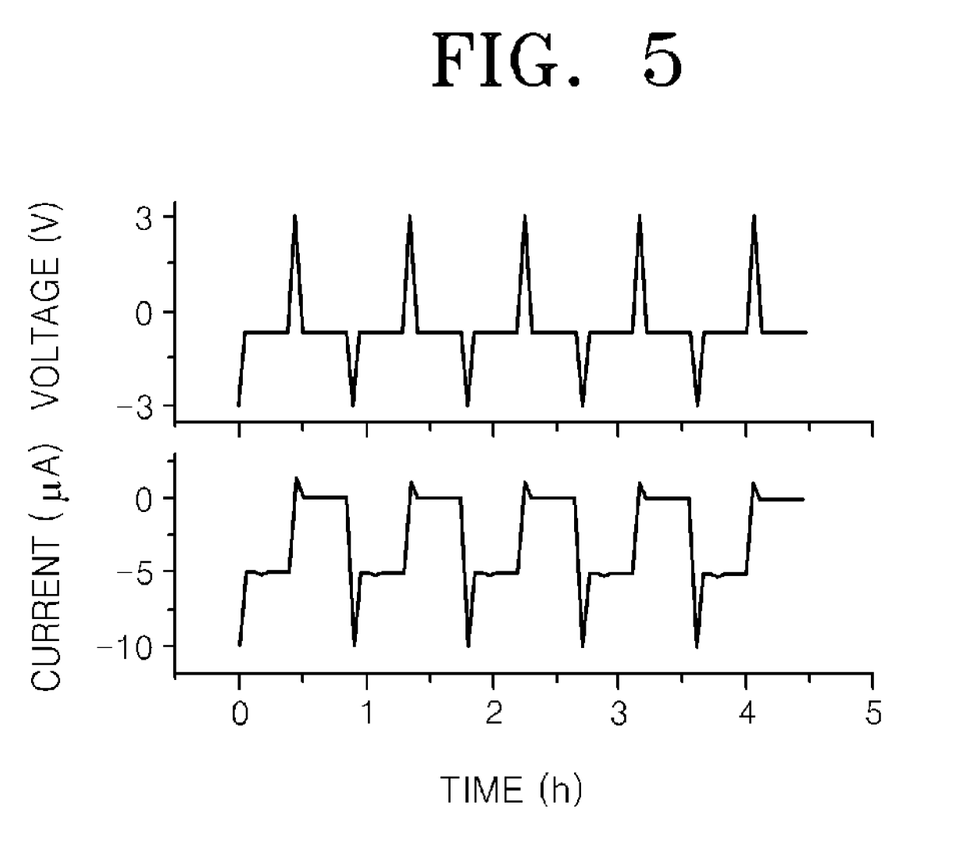
FIG. 5 is a view illustrating the memory characteristics of a molecular electronic device according to an embodiment of the present invention.

FIG. 5 is a view illustrating the memory characteristics of the molecular electronic devices of Sample 5 manufactured in Example 1.

For evaluation of the memory characteristics, the pulse generator unit was set to generate pulses with frequencies ranging from several Hz to several MHz considering the switching characteristics of molecular electronic devices. The rising/falling time of voltage pulses was set to 100 ns or less.

Hitherto, molecular electronic devices according to the present invention and manufacturing methods thereof have been specifically described. However, the above descriptions are intended to assist the understanding of the invention, and thus, the above-described embodiments can be variously modified by those of ordinary skill in the art. Thus, the technical scope of the present invention for which protection is sought should be defined by the following claims.

A molecular electronic device according to the present invention includes a functional molecular active layer between a first electrode and a second electrode. The second electrode includes a conductive polymer electrode layer contacting with the functional molecular active layer. Thus, the molecular electronic device according to the present invention is structured such that the conductive polymer electrode layer is interposed between a metal electrode layer constituting the second electrode and the functional molecular active layer.

In the molecular electronic device according to the present invention, during forming the metal electrode layer of the second electrode, the conductive polymer electrode layer can prevent damage to the functional molecular active layer, thereby effectively preventing a short circuit between the electrodes of the molecular electronic device. Therefore, a reliable switching/memory device can be realized using the molecular electronic device according to the present invention, thereby increasing the possibility of the practical utilization of the switching/memory device.

Moreover, in the molecular electronic device according to the present invention, the functional molecular active layer is formed as a molecular monolayer on a first electrode using a self-assembly process. This assures manufacture of an ultra-thin (several nanometers in thickness) molecular electronic device. A charging effect of a voltage applied between the first electrode and the second electrode can be controlled by optimizing the thickness of the conductive polymer electrode layer of the second electrode formed on the functional molecular active layer.

As described above, according to the present invention, a conductive polymer electrode layer capable of serving as an organic electrode is formed on an ultra-thin functional molecular active layer formed as a molecular layer which is self-assembled on a metal electrode. Therefore, a short circuit that may be caused by damage to the functional molecular active layer is prevented, thereby enabling the realization of an ultra-thin molecular electronic device which is finely structured at the scale of several nanometers.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A molecular electronic device comprising:
 a first electrode;
 a functional molecular active layer, self-assembled on the first electrode, including an electroactive functional group having a cyclic compound; and
 a second electrode, disposed on the functional molecular active layer, the second electrode including a conductive polymer electrode layer in contact with the functional molecular active layer and a metal electrode layer disposed on the conductive polymer electrode layer,
 wherein the functional molecular active layer is made of at least one material selected from the group consisting of nitrophenylene ethinylene thiol group-containing compounds; nitrophenylene ethinylene silane group-containing compounds; dinitrobipyridyl ethyrylphenyl thiol compounds; S-[4-({4-[(4-acetylsulfonyl-phenyl) -methyl-amino]-phenyl}-methyl-amino)-phenyl thiol compounds; rosebengal thiol group-containing compounds; rosebengal silane group-containing compounds; azo compounds containing a dinitrothiophene group and a thiol derivative-introduced aminobenzene group; azo compounds containing a dinitrothiophene group and a silane derivative-introduced aminobenzene group; organometallic thiol derivative compounds with complexes of a terpyridyl group and a metal element; and organometallic silane derivative compounds with complexes of a terpyridyl group and a metal element.

2. The molecular electronic device of claim 1, wherein the metal element is one selected from the group consisting of cobalt, nickel, iron, and ruthenium.

3. The molecular electronic device of claim 1, wherein the first electrode is a monolayer made of a single metal or a multi-layer having a stack of at least two different metals.

4. The molecular electronic device of claim 1, wherein the metal electrode layer of the second electrode is a monolayer made of a single metal or a multi-layer having a stack of at least two different metals.

5. The molecular electronic device of claim 1, wherein the metal electrode layer of the second electrode has a stack structure of a barrier layer and a metal layer, and
 wherein the barrier layer contacts with the conductive polymer electrode layer.

6. The molecular electronic device of claim 5,
 wherein the barrier layer is made of Ti and the metal layer is made of Au.

7. The molecular electronic device of claim 1, wherein the functional molecular active layer includes a molecular multilayer having a stack of at least two molecular layers.

8. The molecular electronic device of claim 1, wherein the conductive polymer electrode layer is made of PEDOT/PSS (poly(3,4-ethylenedioxythiophene) doped with poly(4-styrenesulonate)), polyaniline, polyaniline doped with a sulfonic acid, polypyrrole, polythiophene, poly(3,4-ethylenethiophene), polyporphyrin, or polymetallocene.

9. The molecular electronic device of claim 1, wherein the conductive polymer electrode layer is interposed between the functional molecular active layer and the metal electrode layer.

10. The molecular electronic device of claim 1, wherein the functional molecular active layer includes a molecular layer formed by selectively binding a compound comprising a thiol derivative or a silane derivative as an anchoring group on the first electrode using a self-assembly process.

11. The molecular electronic device of claim 1, wherein the functional molecular active layer includes a molecular monolayer.

* * * * *